United States Patent
Fujita et al.

(10) Patent No.: US 10,741,650 B2
(45) Date of Patent: Aug. 11, 2020

(54) SEMICONDUCTOR DEVICE AND METHOD OF MANUFACTURING THE SAME

(71) Applicant: Toshiba Memory Corporation, Tokyo (JP)

(72) Inventors: Tsutomu Fujita, Yokkaichi Mie (JP); Takanobu Ono, Kuwana Mie (JP); Makoto Minaminaka, Suzuka Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,934

(22) Filed: Sep. 4, 2017

(65) Prior Publication Data

US 2018/0277640 A1 Sep. 27, 2018

(30) Foreign Application Priority Data

Mar. 21, 2017 (JP) .................. 2017-055128

(51) Int. Cl.

| | |
|---|---|
| *H01L 29/34* | (2006.01) |
| *H01L 21/268* | (2006.01) |
| *H01L 21/324* | (2006.01) |
| *H01L 23/00* | (2006.01) |
| *H01L 21/683* | (2006.01) |

(Continued)

(52) U.S. Cl.
CPC ............ *H01L 29/34* (2013.01); *H01L 21/268* (2013.01); *H01L 21/3247* (2013.01); *H01L 21/6836* (2013.01); *H01L 21/78* (2013.01); *H01L 24/03* (2013.01); *H01L 24/45* (2013.01); *H01L 24/48* (2013.01); *H01L 23/3142* (2013.01); *H01L 24/05* (2013.01); *H01L 24/49* (2013.01); *H01L 2224/037* (2013.01); *H01L 2224/04042* (2013.01); *H01L 2224/4502* (2013.01); *H01L 2224/481* (2013.01); *H01L 2224/49171* (2013.01); *H01L 2224/85123* (2013.01); *H01L 2924/00014* (2013.01); *H01L 2924/10155* (2013.01); *H01L 2924/10156* (2013.01)

(58) Field of Classification Search
CPC .............................. H01L 29/34; H01L 24/05
See application file for complete search history.

(56) References Cited

U.S. PATENT DOCUMENTS

| | | |
|---|---|---|
| 8,815,705 B2 | 8/2014 | Kato |
| 9,566,791 B2 | 2/2017 | Shibata |
| 2014/0009898 A1 | 1/2014 | Yamamoto |

(Continued)

FOREIGN PATENT DOCUMENTS

| | | |
|---|---|---|
| JP | 2006-140356 | 6/2006 |
| JP | 2016-157872 | 9/2016 |
| TW | 201304107 A | 1/2013 |

*Primary Examiner* — Julio J Maldonado
*Assistant Examiner* — Hajar Kolahdouzan
(74) *Attorney, Agent, or Firm* — Kim & Stewart LLP

(57) ABSTRACT

According to one embodiment, a semiconductor device includes a semiconductor element having a substrate with at least two bending portions formed on a first side surface thereof. The two bending portions are displaced from each other in a first direction that is perpendicular to the first side surface of the substrate and parallel to a front surface of the substrate and in a second direction parallel to the front surface of the substrate and perpendicular to a top surface of the substrate. A rearmost portion of the first side surface is substantially perpendicular to the front surface.

18 Claims, 8 Drawing Sheets

(51) Int. Cl.
    *H01L 21/78*     (2006.01)
    *H01L 23/31*     (2006.01)

(56) References Cited

U.S. PATENT DOCUMENTS

2016/0158880 A1    6/2016   Koitzsch et al.
2016/0276535 A1*  9/2016   Lin .................... H01L 33/20

\* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2017-055128, filed Mar. 21, 2017, the entire contents of which are incorporated herein by reference.

FIELD

An embodiment of the present disclosure relates to a semiconductor device and a method of manufacturing the same.

BACKGROUND

A semiconductor device is formed by focusing a laser inside a wafer along the outer shape of a semiconductor element and then dividing and fragmenting the wafer into a plurality of semiconductor elements. Then, a sealing material is provided on each semiconductor element so as to tightly fix the semiconductor element and the sealing material for forming a semiconductor device. In such a semiconductor device, it is desirable to increase the strength of the semiconductor element while increasing the adhesion between the semiconductor element and the sealing material.

DETAILED DESCRIPTION

Figure 1:
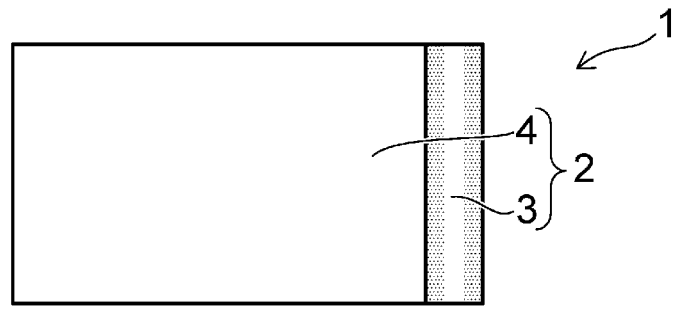
FIG. 1 is a top view showing a semiconductor device according to a first embodiment.

Embodiments provide a semiconductor device with improved adhesion and strength, and a method of manufacturing the same.

In general, according to one embodiment, a semiconductor device includes a semiconductor element having a substrate with at least two bending portions formed on a first side surface thereof. The two bending portions are displaced from each other in a first direction that is perpendicular to the first side surface of the substrate and parallel to a front surface of the substrate and in a second direction parallel to the front surface of the substrate and perpendicular to a top surface of the substrate. A rearmost portion of the first side surface is substantially perpendicular to the front surface.

Each embodiment of the present disclosure will be described below with reference to the accompanying drawings. It is noted that the drawings are schematic or conceptual, and relationship between the thickness and width of each portion, and the size ratio between portions do not always reflect the actual dimensions. Further, even if the same portions are shown, respective dimensions and ratios may be differently shown in some drawings. It is noted that, in the specification and respective drawings, the same reference numerals are assigned to the same elements as those already described with reference to previous drawings, and detailed description thereof may be omitted as appropriate.

Figure 2:
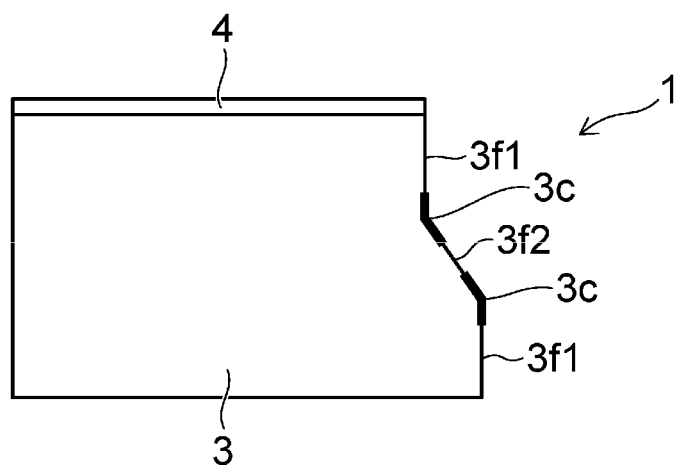
FIG. 2 is a front view showing the semiconductor device according to the first embodiment.
Figure 3:
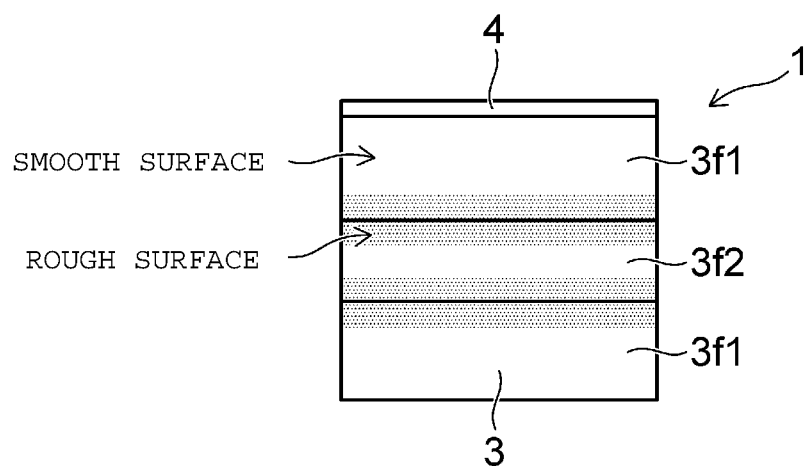
FIG. 3 is a side view showing the semiconductor device according to the first embodiment.

FIGS. 1 to 3 show a top view, a front view and a side view, respectively, of a semiconductor device 1. As shown in FIGS. 1 to 3, the semiconductor device 1 is provided with a semiconductor element 2 having a wafer 3 and a semiconductor layer 4. For example, the semiconductor element 2 is a chip, and the wafer 3 contains silicon (Si). The semiconductor layer 4 is provided on the surface of the wafer 3 and has a wiring layer and the like.

As shown in FIG. 2, bending points 3c are provided on a side surface of the wafer 3. By providing the bending points 3c, steps are formed, and surfaces 3f1 substantially perpendicular to the surface of the wafer 3 and an inclined surface 3f2 are formed.

It is desirable that each step formed by each bending point 3c is formed such that the width in the vertical direction is 32 micrometers or more and 80 micrometers or less, and the width in the horizontal direction is 4 micrometers or more and 30 micrometers or less, for example. This makes it possible to improve adhesion of the semiconductor element 2 to a sealing material when the sealing material containing a resin or the like is formed on the semiconductor element 2.

As shown in FIG. 3, in the wafer 3, the bending point 3c is, for example, a boundary portion between the surface 3f1 and the inclined surface 3f2. Each of a part of the surface 3f1 and a part of the inclined surface 3f2 near the bending point 3c corresponds to a rough surface. Each of a part of the surface 3f1 and a part of the inclined surface 3f2 apart from the bending point 3c corresponds to a smooth surface. That is, the side surface of the wafer 3 includes a combination of rough surfaces and smooth surfaces.

Here, a rough surface refers to a surface having a residual stress in a predetermined range, for example, −300 MPa or less, or 300 MPa or more. That is, the rough surface is formed when forming modified layers, explained herein with reference to FIGS. 14 and 15. A smooth surface refers to a surface having a residual stress in a predetermined range, for example, −100 MPa or more and 100 MPa or less. That is, the smooth surface is a cleavage plane (i.e., a plane that splits along a crystal). For example, the residual stress (Pa) of the rough and smooth surfaces is measured using Raman spectroscopy.

It is desirable that the rough and smooth surfaces are formed such that the roughness (Rz) of the rough surface is 1 micrometer or more and 10 micrometers or less, and the roughness (Rz) of the smooth surface is 0.01 micrometer or more and 0.5 micrometers or less. This makes it possible to increase the strength of the semiconductor element 2 and improve the adhesion between the semiconductor element 2 and the sealing material.

Figure 4:
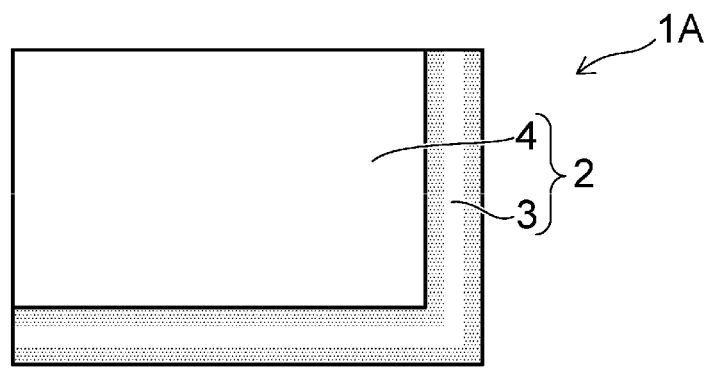
FIG. 4 is a top view showing a semiconductor device according to a first modification of the first embodiment.
Figure 5:
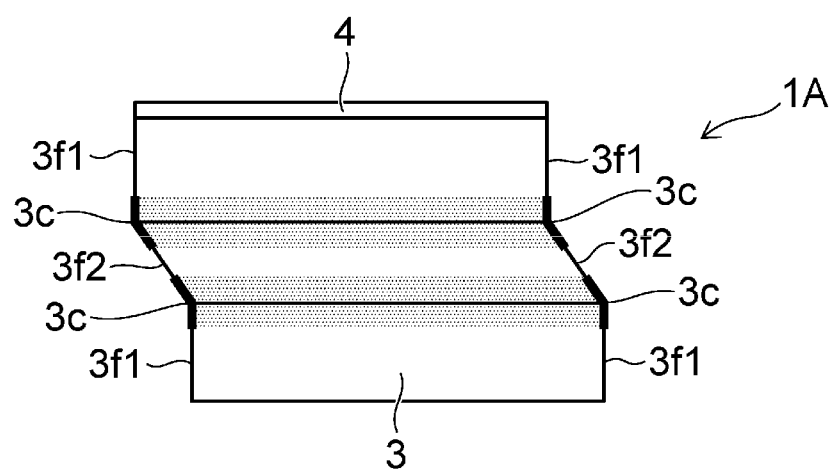
FIG. 5 is a front view showing the semiconductor device according to the first modification of the first embodiment.
Figure 6:
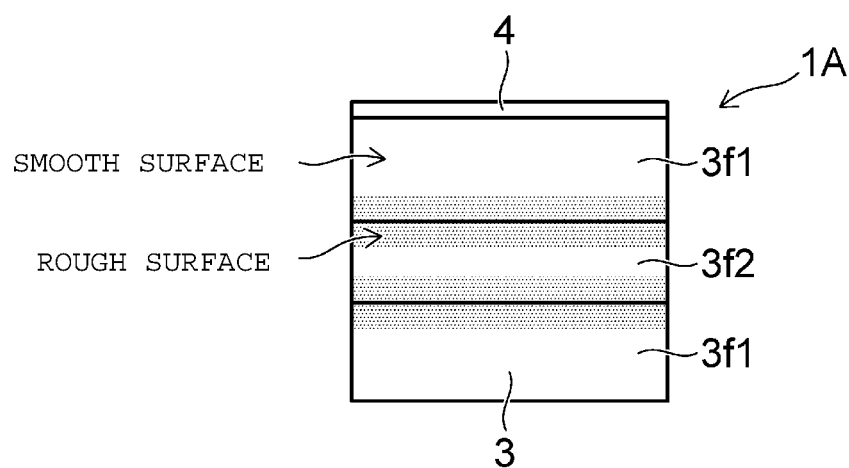
FIG. 6 is a side view showing the semiconductor device according to the first modification of the first embodiment.
Figure 7:
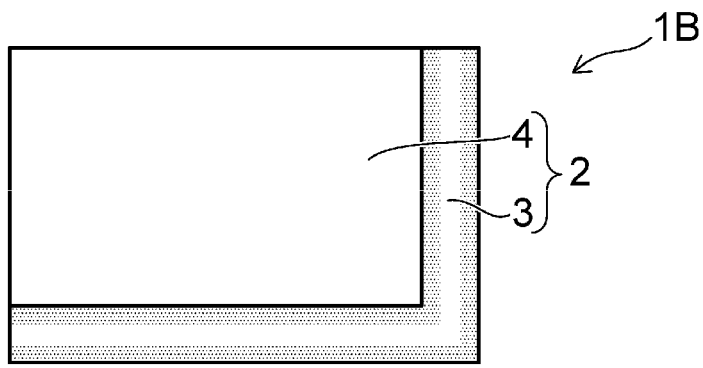
FIG. 7 is a top view showing a semiconductor device according to a second modification of the first embodiment.
Figure 8:
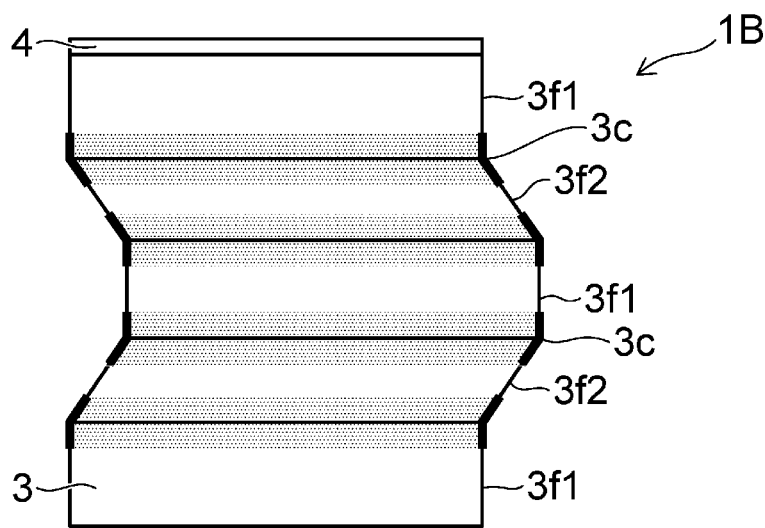
FIG. 8 is a front view showing the semiconductor device according to the second modification of the first embodiment.
Figure 9:
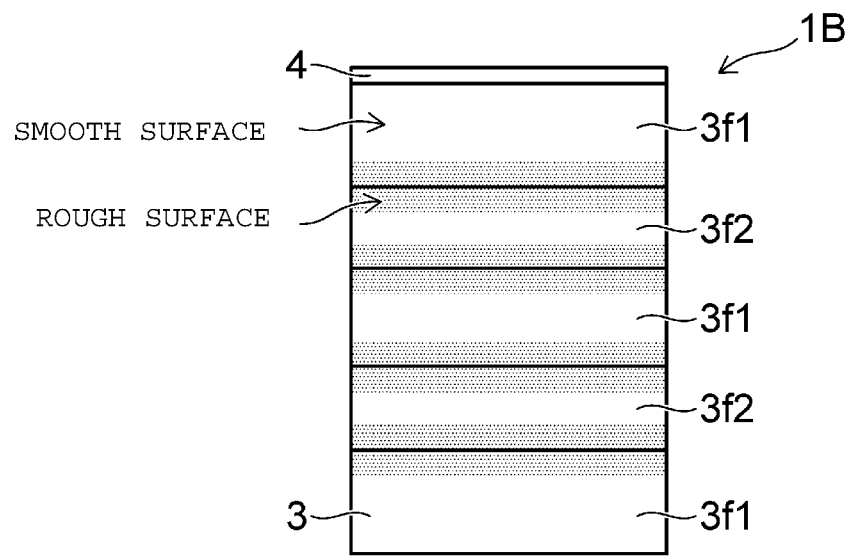
FIG. 9 is a side view showing the semiconductor device according to the second modification of the first embodiment.
Figure 10:
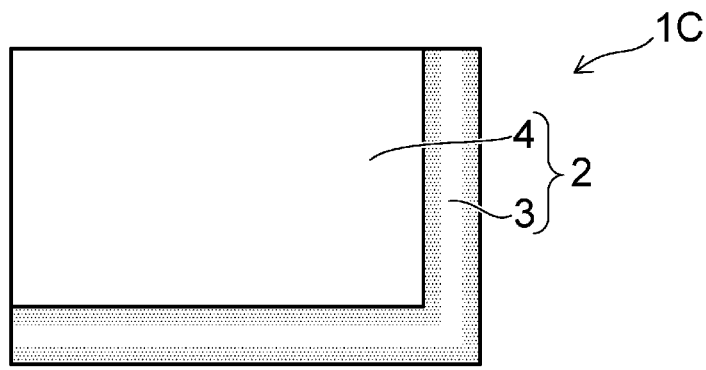
FIG. 10 is a top view showing a semiconductor device according to a third modification of the first embodiment.
Figure 11:
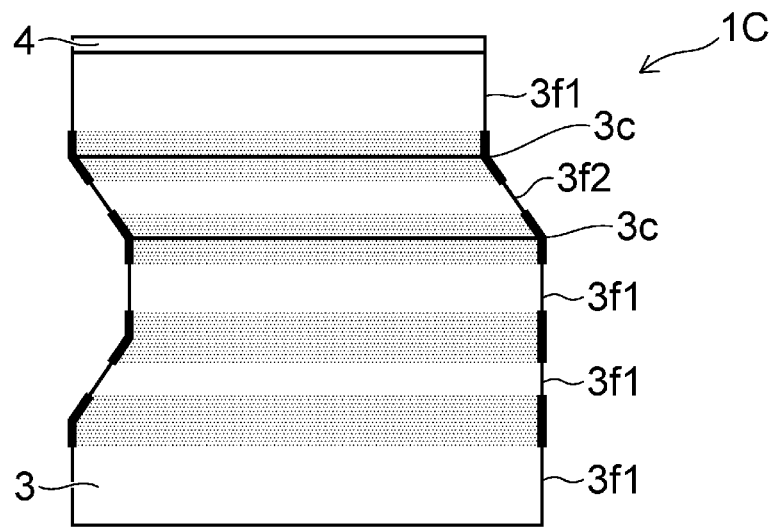
FIG. 11 is a front view showing the semiconductor device according to the third modification of the first embodiment.
Figure 12:
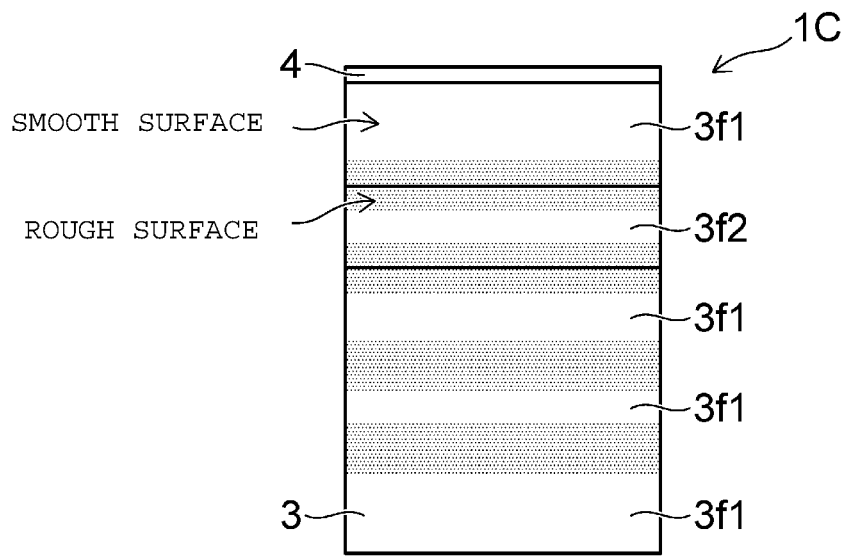
FIG. 12 is a side view showing the semiconductor device according to the third modification of the first embodiment.

Modifications of the present embodiment will be described below. FIGS. 4 to 6 show a top view, a front view and a side view, respectively, in a semiconductor device 1A. FIGS. 7 to 9 show a top view, a front view and a side view, respectively, in a semiconductor device 1B. FIGS. 10 to 12 show a top view, a front view and a side view, respectively, in a semiconductor device 1C. First, a first modification of the first embodiment will be described.

As shown in FIGS. 4 to 6, in the semiconductor device 1A, a semiconductor element 2 having a wafer 3 and a semiconductor layer 4 is provided. In the first embodiment (shown in FIGS. 1-3), steps formed by the bending points 3c are provided on one side surface of the four side surfaces of the wafer 3 of the semiconductor element 2. On the other hand, in this modification, steps formed by the bending points 3c are provided on more than one surface among the four side surfaces of the wafer 3 of the semiconductor element 2.

Next, a second modification of the embodiment will be described. As shown in FIGS. 7 to 9, in the semiconductor device 1B, a semiconductor element 2 having a wafer 3 and a semiconductor layer 4 is provided. In the first embodiment (shown in FIGS. 1-3), two steps formed by the bending points 3c are provided on a side surface of the wafer 3 of the semiconductor element 2. On the other hand, in the modification, three or more steps formed by the bending points 3c are provided on the side surface of the wafer 3 of the semiconductor element 2.

Next, a third modification of the embodiment will be described. As shown in FIGS. 10 to 12, in the semiconductor device 1C, a semiconductor element 2 having a wafer 3 and a semiconductor layer 4 is provided. In the modification, a rough surface may be formed in a part of a surface 3/1 even when no bending point 3c is formed, i.e., no step is formed.

Hereinafter, a method of manufacturing the semiconductor device 1 according to the embodiment will be described. FIG. is a flowchart showing a method of manufacturing the semiconductor device 1. In the method of manufacturing the semiconductor device 1 according to the embodiment, dicing is performed along a dicing line on the wafer 3 to fragment the wafer 3 into a plurality of semiconductor elements 2. First, as an example of a dicing technique of fragmenting the wafer 3 into a plurality of semiconductor elements 2, a stealth dicing technique will be briefly described.

Figure 13:
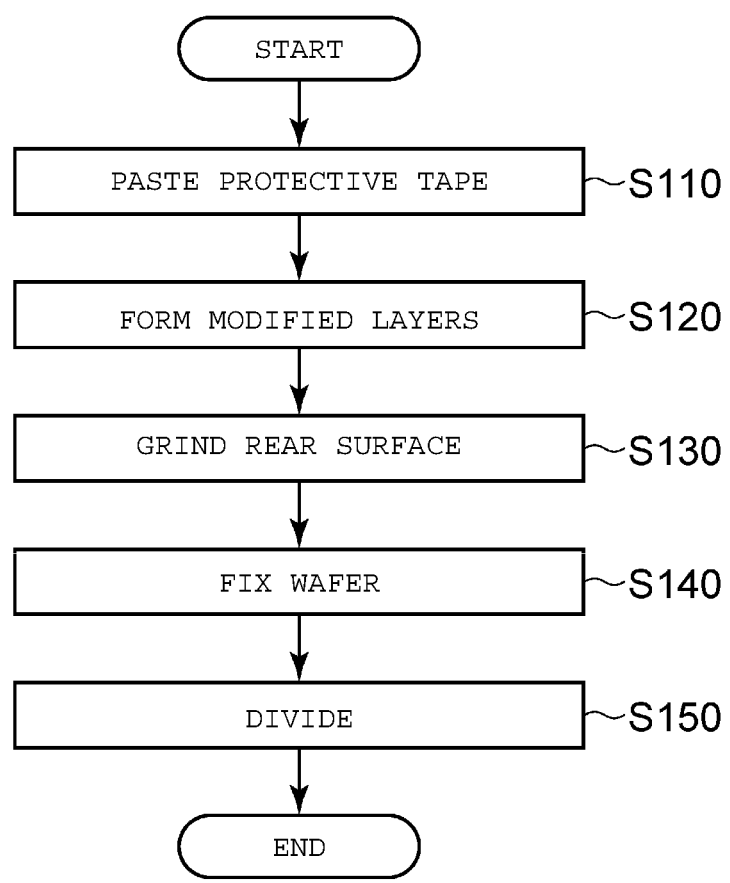
FIG. 13 is a flowchart showing a method of manufacturing the semiconductor device according to the first embodiment.

As shown in FIG. 13, first, a protective tape is pasted on the front surface of the wafer 3 (S110). For example, a semiconductor layer 4 is provided on the front surface of the wafer 3. Next, a laser is irradiated from the rear surface of the wafer 3, and the laser is condensed inside the silicon to form modified layers (S120). As the modified layers expand, cracks develop up and down, and a half cut portion is formed on the front surface of the wafer 3. The laser is, for example, a transmission laser in the infrared region. For example, the output of the laser is 0.1 W.

Next, the rear surface of the wafer is ground with a grinding wheel to thin it (S130). When it is thinly ground, the half cut portion is exposed, and the semiconductor device 1 is fragmented.

Next, a tape is bonded to the rear surface of the wafer 3 with an adhesive, and the periphery of the wafer 3 is fixed with a support (S140). Here, the adhesive is, for example, DAF (Die Attach Film). The tape is formed out of, for example, a base material and a pressure-sensitive adhesive. The support is, for example, a ring that fixes the periphery of the wafer 3.

Next, the tape and the wafer 3 are pushed up from the bottom with a pressing body (S150). As a result, the distance between the chips is increased to divide the adhesive portion. Here, the pressing body is, for example, an expansion ring. The dicing process shown in S110 to S150 as described above causes fragmentation of the wafer 3 into a plurality of semiconductor elements 2.

Figure 14:
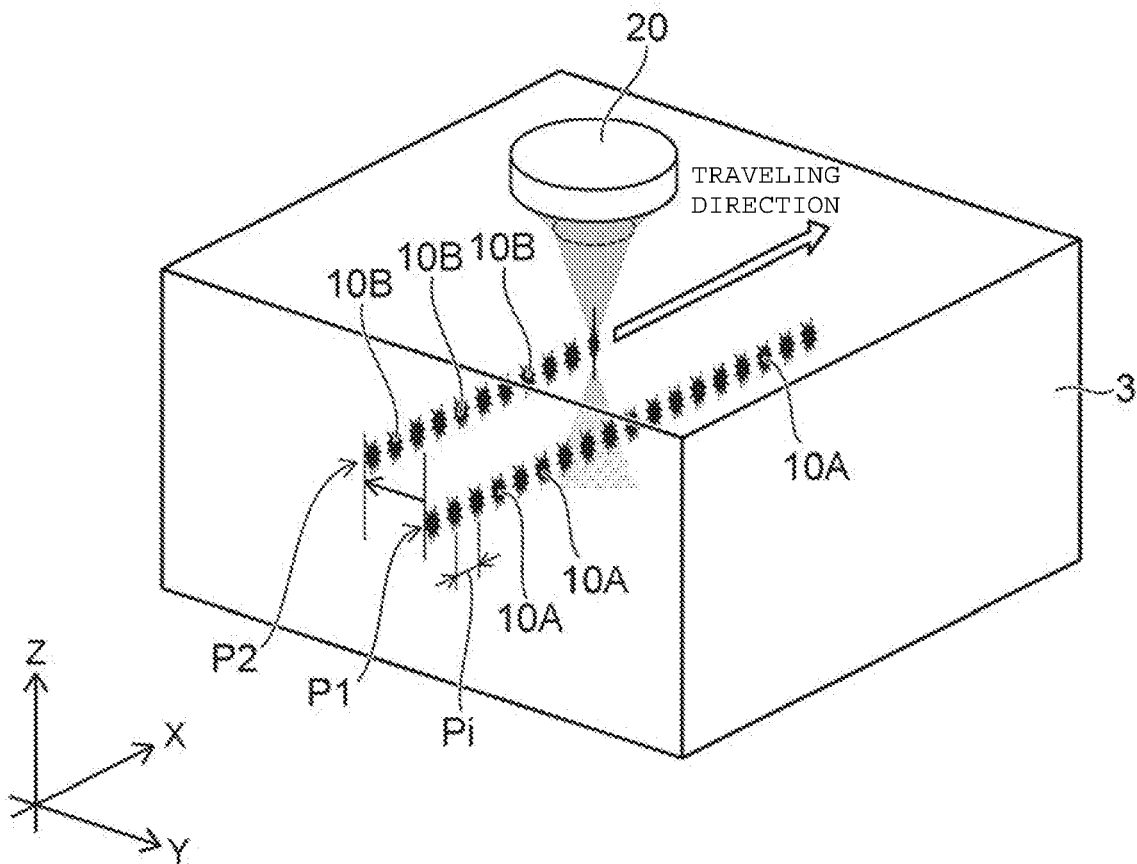
FIG. 14 is a perspective view showing a part of the method of manufacturing the semiconductor device according to the first embodiment.
Figure 15:
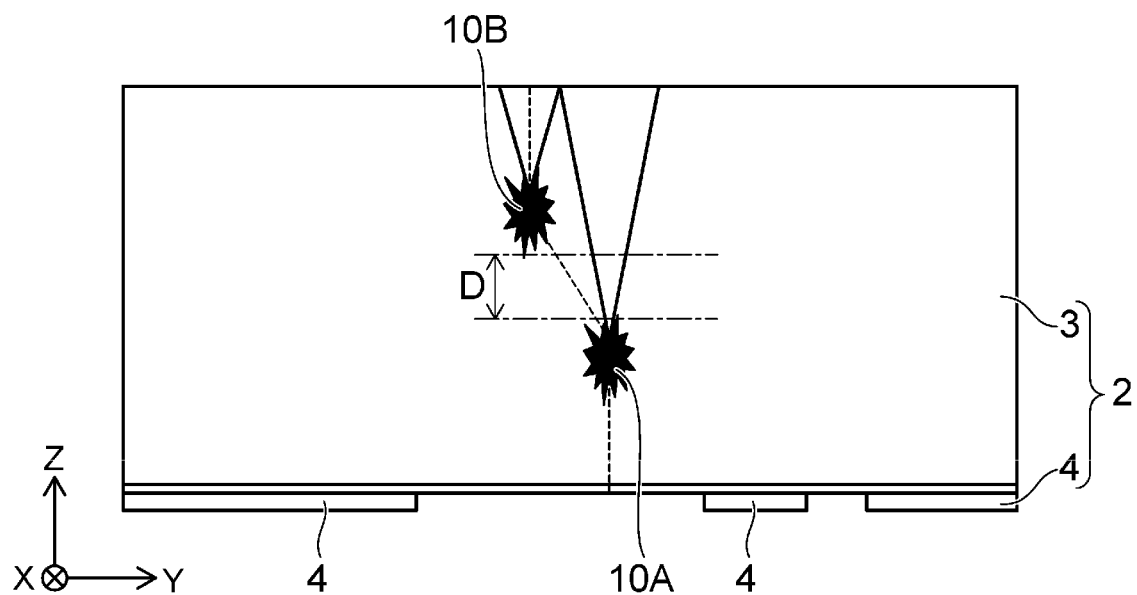
FIG. 15 is a cross-sectional view showing a part of the method of manufacturing the semiconductor device according to the first embodiment.

Hereinafter, a process of forming a step by forming a bending point 3c on the wafer 3 of the semiconductor element 2 in the dicing process will be described. FIGS. 14 and 15 are a perspective view and a sectional view, respectively, showing the formation of modified layers in the dicing process. Here, in this specification, two directions parallel to the front surface of the wafer 3 and orthogonal to each other are defined as the X direction and the Y direction. A direction orthogonal to both the X direction and the Y direction is defined as the Z direction.

As shown in FIGS. 14 and 15, modified layers 10A and 10B are formed along the dicing line. For example, the modified layers 10A and 10B are continuously formed by irradiating a laser in the traveling direction (X direction as depicted) of a beam head 20.

The modified layers 10A are formed near a front surface of the wafer 3 in the vertical direction (Z direction as depicted), as compared with the modified layers 10B. The modified layers 10A form a path P1 in the traveling direction of the beam head 20.

The modified layers 10B are formed near a rear surface of the wafer 3 in the vertical direction, as compared with the modified layers 10A. Further, the modified layers 10B are displaced from the modified layers 10A by a predetermined interval in a direction (for example, the Y direction) intersecting the traveling direction of the beam head 20. The modified layers 10B form a path P2 in the traveling direction of the beam head 20. The traveling direction of the beam head 20 is the direction in which the paths P1 and P2 are formed.

For example, the path P1 and the path P2 (that is, the modified layers 10A and the modified layers 10B) are formed so as not to overlap each other when viewed from the vertical direction. For example, the vertical interval between the paths P1 and P2 (depicted as D) is about 4 micrometers. For example, the interval between the modified layers 10A of the path P1 and the interval depicted as Pi between the modified layers 10B of the path P2 are about 1 micrometer.

In this way, in the process of forming the modified layers in the dicing process (S120 in FIG. 13), by forming the path P1 and the path P2 displaced from the path P1 by a predetermined interval in the Y direction, the cleavage proceeds in the vertical direction and in the direction inclined in the vertical direction on each of the path P1 and the path P2 (that is, the modified layers 10A and the modified layers 10B). Thus, after the dicing process, the bending points 3c are formed on the wafer 3 of the semiconductor element 2 as shown in FIGS. 1 to 3. That is, steps are formed on the wafer 3, and surfaces 3/1 substantially perpendicular to the X-Y plane and an inclined surface 3/2 are formed.

Figure 16A:
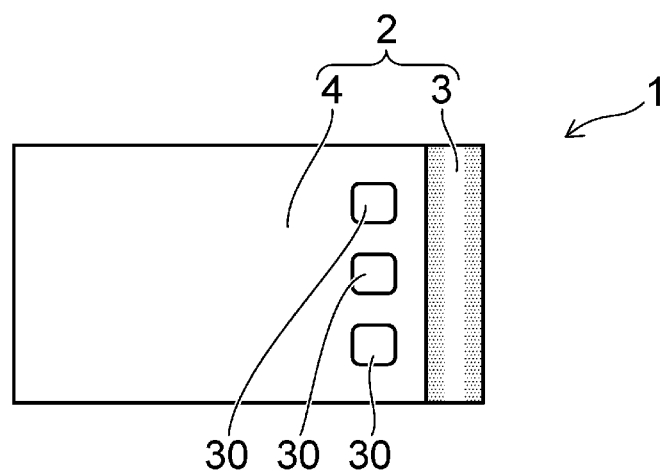
FIGS. 16A and 16B are a top view and a front view, respectively, illustrating positioning in the semiconductor device.
Figure 16B:
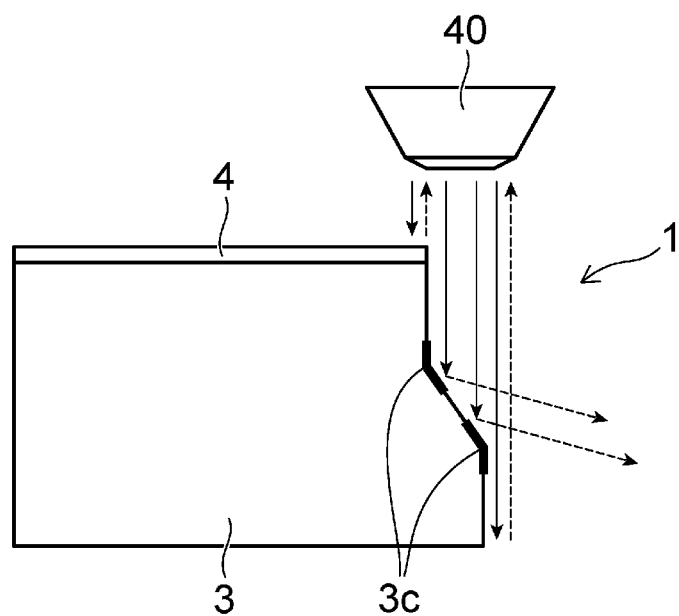
Figure 17A:
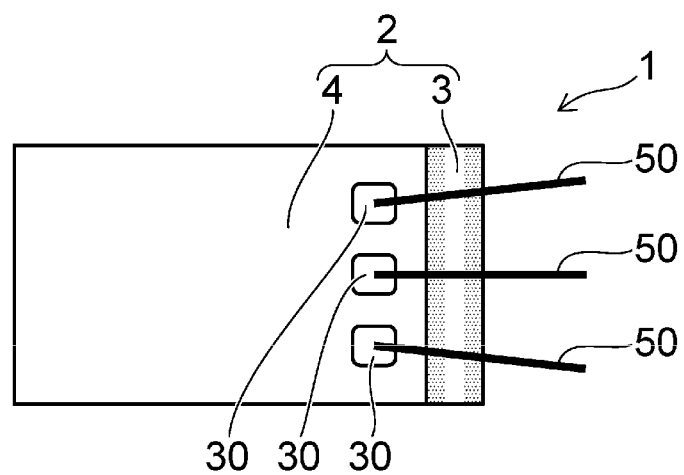
FIGS. 17A and 17B are a top view and a front view, respectively, illustrating wire bonding in the semiconductor device.
Figure 17B:
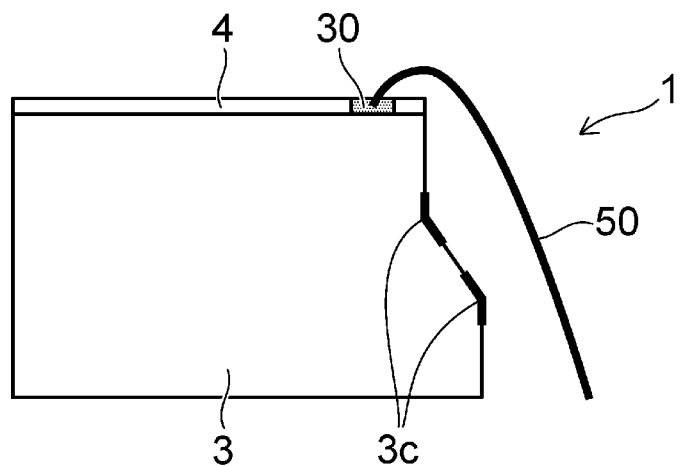

Hereinafter, effects of the embodiment will be described. FIGS. 16A and 16B are diagrams illustrating positioning in the semiconductor device 1. FIG. 17A and FIG. 17B are diagrams illustrating wire bonding in the semiconductor device 1.

In the embodiment, bending points 3c are provided on the wafer 3 of the semiconductor element 2. Thereby, steps are formed on the wafer 3, and surfaces 3/1 substantially perpendicular to the X-Y plane and an inclined surface 3/2 are formed. Therefore, by making a part of the surface 3/1 and a part of the inclined surface 3/2 near the bending point 3c rough, when a sealing material is formed on the semiconductor element 2, the adhesion between the semiconductor element 2 and the sealing material can be improved. On the other hand, in the wafer 3, a smooth surface is formed in the portion excluding the rough surface, thus, the decrease in the strength of the semiconductor element 2 is suppressed. Further, as shown in the modifications of FIGS. 4 to 9, by increasing the number of steps formed by the bending points 3c, the adhesion between the semiconductor element 2 and the sealing material can be further improved.

In addition, in the embodiment, as shown in FIGS. 16A and 16B, the positional accuracy at the time of forming a bonding pad 30 on the semiconductor element 2 can be improved. At the time of bonding, the position of the semiconductor element 2 is recognized by a camera 40, and the end portion of the semiconductor element 2 may be emphasized by the shape of the steps on the side surface of the wafer 3 of the semiconductor element 2 as indicated by an arrow in FIG. 16B. As a result, the visibility with the camera 40 is improved, and the positional accuracy at the time of forming the bonding pad 30 is improved.

Furthermore, in the embodiment, as shown in FIGS. 17A and 17B, when the bonding pad 30 is formed on the semiconductor element 2 and a wire 50 is connected to the bonding pad 30, the distance between the bonding pad 30 and the end portion of the semiconductor element 2 is shortened. Thus, the likelihood that the wire 50 is brought into contact with the end portion of the semiconductor element 2, causing a defect, is reduced.

According to the embodiments, it is possible to provide a semiconductor device with improved adhesion and strength, and a method of manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor element including a semiconductor substrate having a front surface, a back surface parallel to the front surface, and a first side surface extending between the front surface and the back surface,
   wherein the first side surface includes a first portion connected to the front surface and extending in a first direction that is perpendicular to the front surface, a first bending portion connected to the first portion, an inclined portion connected to the first bending portion, a second bending portion connected to the inclined portion, a second portion connected to the second bending portion and extending in the first direction from the back surface so as to be perpendicular to the back surface and connected to the back surface, the first and second bending portions being displaced from each other in the first direction and a second direction that is parallel to the front surface.

2. The semiconductor device according to claim 1, wherein a residual stress of at least a portion of the first side surface adjacent to one of the first and second bending portions is −300 MPa or less or 300 MPa or more.

3. The semiconductor device according to claim 2, wherein a residual stress of a portion of the first side surface not adjacent to one of the first and second bending portions is −100 MPa or more or 100 MPa or less.

4. The semiconductor device according to claim 3, wherein the portion of the first side surface that is adjacent to the one of the first and second bending portions has a surface roughness of 1 micrometer or more.

5. The semiconductor device according to claim 4, wherein the surface roughness of the portion of the first side surface that is adjacent to the one of the first and second bending portions is 10 micrometers or less.

6. The semiconductor device according to claim 3, wherein the portion of the first side surface that is not adjacent to the one of the first and second bending portions has a surface roughness of 0.01 micrometer or more.

7. The semiconductor device according to claim 6, wherein the surface roughness of the portion that is not adjacent to the one of the first and second bending portions is 0.5 micrometers or less.

8. The semiconductor device according to claim 1, further comprising a second side surface opposite the first side surface, the second side surface having at least two bending portions.

9. The semiconductor device according to claim 8, wherein the first and second bending portions of the first side surface bend in a same direction as corresponding bending portions of the second side surface.

10. The semiconductor device according to claim 8, wherein the first and second bending portions of the first side surface bend in an opposite direction as corresponding bending portions of the second side surface.

11. A semiconductor device, comprising:
    a semiconductor element substrate having a first surface in a first plane, a second surface in a second plane parallel to the first surface, and a first side surface extending between the first and second planes and connecting the first surface and the second surface, wherein
    the first side surface has:
    a first portion meeting the first surface, the first portion extending in a third plane that is orthogonal to the first and second planes,
    a first angled portion meeting the first portion at a first transition portion, the first angled portion extending in a fourth plane that crosses the third plane and the first and second planes, and a second portion meeting the first angled portion at a second transition portion, the second portion extending in a fifth plane that is parallel to the third plane, the second portion being offset from the first portion in a first direction that is parallel to the first plane and meeting the second surface.

12. The semiconductor device according to claim 11, wherein the first transition portion and the second transition are not aligned with each other along any direction orthogonal to the first plane.

13. The semiconductor device according to claim 11, further comprising:

a semiconductor element on the first surface of the semiconductor element substrate.

14. The semiconductor device according to claim 11, wherein a residual stress of at least a portion of the first side surface adjacent to one of the first and second transition portions is −300 MPa or less or 300 MPa or more.

15. The semiconductor device according to claim 14, wherein a residual stress of a portion of the first side surface not adjacent to one of the first and second transition portions is −100 MPa or more or 100 MPa or less.

16. The semiconductor device according to claim 11, wherein a portion of the first side surface that is adjacent to the one of the first and second transition portions has a surface roughness of 1 micrometer to 10 micrometers.

17. The semiconductor device according to claim 11, wherein a portion of the first side surface that is not adjacent to the one of the first and second transition portions has a surface roughness between 0.01 micrometer and 0.5 micrometers.

18. The semiconductor device according to claim 11, wherein the semiconductor substrate element has a second side surface on a side opposite to the first side surface in a direction parallel to the first plane.

\* \* \* \* \*